(12) United States Patent
Ashraf et al.

(10) Patent No.: US 11,664,232 B2
(45) Date of Patent: May 30, 2023

(54) METHOD AND APPARATUS FOR PLASMA ETCHING

(71) Applicant: SPTS Technologies Limited, Newport (GB)

(72) Inventors: Huma Ashraf, Newport (GB); Kevin Riddell, Newport (GB); Codrin Prahoveanu, Newport (GB)

(73) Assignee: SPTS Technologies Limited, Newport (GB)

( * ) Notice: Subject to any disclaimer, the term of this patent is extended or adjusted under 35 U.S.C. 154(b) by 0 days.

(21) Appl. No.: 17/098,426

(22) Filed: Nov. 15, 2020

(65) Prior Publication Data
US 2021/0193471 A1  Jun. 24, 2021

(30) Foreign Application Priority Data
Dec. 23, 2019 (GB) ...................................... 1919215

(51) Int. Cl.
*H01L 21/3065* (2006.01)
*H01J 37/32* (2006.01)
(Continued)

(52) U.S. Cl.
CPC .... *H01L 21/3065* (2013.01); *H01J 37/32082* (2013.01); *H01J 37/32449* (2013.01); *H01J 37/32715* (2013.01); *H01L 21/308* (2013.01); *H01L 21/67069* (2013.01); *H01L 21/6831* (2013.01); *H01J 2237/2007* (2013.01); *H01J 2237/334* (2013.01); *H01L 29/16* (2013.01); *H01L 29/1608* (2013.01)

(58) Field of Classification Search
None
See application file for complete search history.

(56) References Cited

U.S. PATENT DOCUMENTS

| 6,071,828 A | 6/2000 | Mihara |
| 6,770,567 B2 | 8/2004 | Ko et al. |
| 7,439,188 B2 | 10/2008 | Deornellas et al. |

(Continued)

FOREIGN PATENT DOCUMENTS

EP  2717298 A2  4/2014

OTHER PUBLICATIONS

IPO, Search Report for GB Application No. 1919215.2, dated Sep. 16, 2020.
(Continued)

*Primary Examiner* — Shamim Ahmed
(74) *Attorney, Agent, or Firm* — Hodgson Russ LLP

(57) ABSTRACT

A structure comprising a substrate and a component which forms involatile metal etch products is plasma etched. A structure comprising a substrate and a component which forms involatile metal etch products is provided. The structure is positioned on a support within a chamber having a first gas inlet arrangement comprising one or more gas inlets and a second gas inlet arrangement comprising one or more gas inlets. The structure is etched by performing a first plasma etch step using a first etch process gas mixture which is only introduced into the chamber through the first gas inlet arrangement. The structure is further etched by performing a second plasma etch step using a second etch process gas mixture which is only introduced into the chamber through the second gas inlet arrangement.

11 Claims, 4 Drawing Sheets

(51) Int. Cl.
*H01L 21/308* (2006.01)
*H01L 21/67* (2006.01)
*H01L 21/683* (2006.01)
*H01L 29/16* (2006.01)

(56) References Cited

U.S. PATENT DOCUMENTS

| | | |
|---|---|---|
| 2003/0013314 A1 | 1/2003 | Ying et al. |
| 2004/0157459 A1 | 8/2004 | Ying et al. |
| 2004/0203242 A1 | 10/2004 | Stojakovic et al. |
| 2005/0099078 A1* | 5/2005 | Vanhaelemeersch ........................ H01L 21/31111 310/120 |
| 2007/0178698 A1 | 8/2007 | Okita et al. |
| 2008/0233757 A1* | 9/2008 | Honda ............... H01J 37/32091 438/711 |
| 2009/0047784 A1* | 2/2009 | Fuller ............... H01L 21/31138 438/691 |
| 2009/0242516 A1* | 10/2009 | Honda ............... H01J 37/32027 216/71 |
| 2011/0100954 A1 | 5/2011 | Satake et al. |
| 2011/0117311 A1 | 5/2011 | Birkmeyer et al. |
| 2013/0034968 A1* | 2/2013 | Zhang ............... H01L 21/31116 438/718 |
| 2013/0115781 A1 | 5/2013 | Matsumoto et al. |
| 2018/0323074 A1* | 11/2018 | Harrison ........... H01L 21/02057 |
| 2018/0330958 A1* | 11/2018 | Kumakura ........ H01L 21/67069 |

OTHER PUBLICATIONS

EPO, Extended European Search Report for EP Application No. 20202066.5, dated Jun. 1, 2021.

* cited by examiner

METHOD AND APPARATUS FOR PLASMA ETCHING

CROSS-REFERENCE TO RELATED APPLICATIONS

This application claims priority to the patent application filed Dec. 23, 2019 and assigned UK Patent App. No. 1919215.2, the disclosure of which is hereby incorporated by reference.

FIELD OF THE DISCLOSURE

The present invention relates to a method of plasma etching, particularly a method of plasma etching a structure comprising a substrate and a component which forms involatile metal etch products. The invention also relates to an apparatus for plasma etching.

BACKGROUND OF THE DISCLOSURE

Plasma etching is a common technique in the field of semiconductor device manufacturing. An undesirable side effect of the etching process is a build-up of material on the interior of the chamber in which etching takes place. Once the material reaches a certain thickness, the chamber must be cleaned periodically to prevent the material from flaking away from the chamber walls and contaminating the system. This period is known as the mean time between cleans (MTBC). A longer MTBC is desired, as this increases the productivity of the plasma apparatus.

Substantial problems may be encountered when etching certain structures which comprise a substrate and another component which, when etched, forms involatile metal etch products. A particular problem is encountered when etching PZT (lead zirconate titanate) which typically utilises noble metal electrodes such as Pt. PZT is a piezoelectric material which is commonly used in sensor/actuator applications such as ultrasound transducers, AFM actuators and in microelectronics for the fabrication of non-volatile memory devices. Dry etching of PZT layers presents specific problems especially at large wafer diameter (>150 mm) and high open areas (>80%). The etch by-products are largely involatile, resulting in the coating of process chamber internals with films rich in Pb, Zr and Ti, from the PZT and Pt from the electrodes, along with by-products of process gases used during etching such as carbon, fluorine and oxygen. Whilst the use of $O_2$ batch cleans and $O_2$ inter-wafer cleans can minimise carbon based by-product deposition, the remaining by-products are involatile, and therefore difficult to remove by dry etching. Beyond a certain thickness, variation of film stress in the deposited material can lead to flaking of deposited material. This is worsened by the presence of thermal gradients in the chamber, and/or thermal cycling during idle time, and/or points of poor adhesion. Flaking causes increased numbers of particles and defects on processed wafers. It then becomes necessary to open the vacuum chamber to atmosphere and clean the interior of the chamber using wet/mechanical methods. This results in a MTBC which is lower than desirable. Additionally, flaking of material onto an electrostatic chuck (ESC) can disturb the integrity of the clamping force applied by the ESC. This affects heat transfer between the PZT containing structure and the ESC, leading to non-uniform wafer cooling and a resulting deterioration in process performance. Ultimately this results in defective product. Therefore, there are significant economic consequences associated with flaking, as tool productivity is reduced and also unexpected particle generation can adversely affect device yield. However, as the demand for PZT based devices grows there is an increasing requirement to improve plasma etch processing of the materials in order to improve device yield and increase the productivity of the etch systems.

The present invention, in at least some of its embodiments, is directed to one or more of the problems and desires disclosed above.

BRIEF SUMMARY OF THE DISCLOSURE

In accordance with an aspect of the invention there is provided a method of plasma etching a structure comprising a substrate and a component which forms involatile metal etch products, the method comprising the steps of:
  providing a structure comprising a substrate and a component which forms involatile metal etch products;
  positioning the structure on a support within a chamber having a first gas inlet arrangement comprising one or more gas inlets and a second gas inlet arrangement comprising one or more gas inlets;
  etching the structure by performing a first plasma etch step using a first etch process gas mixture which is only supplied to the chamber through the first gas inlet arrangement; and
  further etching the structure by performing a second plasma etch step using a second etch process gas mixture which is only supplied to the chamber through the second gas inlet arrangement.

In accordance with a further aspect of the invention there is provided a plasma etching apparatus for plasma etching a structure comprising a substrate and a component which forms involatile metal etch products, the apparatus comprising:
  a chamber having a first gas inlet arrangement comprising one or more gas inlets and a second gas inlet arrangement comprising one or more gas inlets;
  a support located within the chamber on which the structure can be positioned;
  a plasma production device; and
  a controller configured to control the first and second gas inlet arrangements so that the structure is etched by performing a first plasma etch step using a first etch process gas mixture which is only supplied to the chamber through the first gas inlet arrangement and further etched by performing a second plasma etch step using a second etch process gas mixture which is only supplied to the chamber through the second gas inlet arrangement.

The present invention utilises a two-step etching process with gas inlet switching to extend the mean time between chamber cleans. It is believed that the higher concentration of precursor gases in the vicinity of the gas inlet leads to increased deposition around the gas inlet. By utilising a two-step etch process with switched gas inlets, the present invention provides greater uniformity in chamber deposition and thereby extends the MTBC.

The gas inlets of the first gas inlet arrangement can be located radially inwardly of the gas inlets of the second gas inlet arrangement or vice versa. The chamber can further comprise a plasma production device. The plasma production device can separate the gas inlets of the first gas inlet arrangement from the gas inlets of the second gas inlet arrangement.

The plasma production device can comprise an annular housing and a plasma generating element disposed within the annular housing. The gas inlets of the first gas inlet arrangement can be located radially inwardly of the annular housing and the gas inlets of the second gas inlet arrangement can be located radially outwardly of the annular housing or vice versa. The plasma generating element can be an RF antenna. The annular housing can be formed from a ceramic material.

The structure can be positioned on a support and an RF bias power applied to the support during the first and second plasma etch steps. Thus, the plasma etching apparatus can comprise a power applying arrangement for applying RF bias power to the support. The RF bias power can be greater in the first plasma etch step than the second plasma etch step.

The first and second plasma etch steps can use different etch process gas mixtures. The second etch process gas mixture can include a fluorocarbon. Said fluorocarbon can be absent from the first etch process gas mixture. Alternatively, the first and second plasma etch steps can use the same etch process gas mixtures.

A structure can be plasma etched using a single first plasma etch step and a single second plasma etch step. Alternatively, it is possible to etch a structure in a cyclical way by alternately repeating the first and second plasma etch steps a desired number of times. When a cyclical etch process is used, it is possible to swap the ordering of the first and second gas inlet arrangements between etch cycles, i.e., in some etch cycles the first etch process gas mixture can be only supplied to the chamber through the second gas inlet arrangement and second etch process gas mixture can be only supplied to the chamber through the second gas inlet arrangement. Therefore, the method can further comprise the steps of: yet further etching the structure by performing the first plasma etch step using the first etch process gas mixture which is only supplied to the chamber through the second gas inlet arrangement; and yet further etching still the structure by performing the second plasma etch step using the second etch process gas mixture which is only supplied to the chamber through the first gas inlet arrangement.

The component of the structure which forms involatile metal etch products can be a piezoelectric layer and/or a metal electrode. The component of the structure which forms involatile metal etch products can be a layer of PZT (lead zirconate titanate) and/or a noble metal electrode, such as a Pt electrode. The layer of PZT can be separated from the semiconductor substrate by one or more layers of other material. The layer of PZT can comprise a lower surface. The lower surface can be separated from the semiconductor substrate by an electrode layer, such as a layer of Pt. Additionally or alternatively, the layer of PZT can be separated from the semiconductor substrate by a barrier layer such as $SiO_2$. The layer of PZT can comprise an upper surface. An electrode layer, such as a layer of Pt, can be present on the upper surface. The structure can further comprise a photo-resist layer or other mask material.

When etching PZT and/or a noble metal electrode, the first etch process gas mixture can consist essentially of $CF_4$, $H_2$ and, optionally, one or more inert diluents such as Ar, and the second etch process gas mixture can consist essentially of $C_4F_8$, $CF_4$, $H_2$ and, optionally, one or more inert diluents such as Ar.

The substrate can be a semiconductor substrate.

The semiconductor substrate can be a silicon substrate. In some embodiments, the semiconductor substrate is a silicon substrate and the component which forms involatile metal etch products is a layer of PZT.

The semiconductor substrate can be a SiC substrate and the component which forms involatile metal etch products can be a metal mask. The plasma etching can comprise backside etching of the SiC substrate through the metal mask.

The first and second gas inlet arrangements can each comprise any suitable number of gas inlets. In principle, the first and/or the second gas inlet arrangement can have a single gas inlet although in practice it is more likely that each gas arrangement will have a plurality of gas inlets.

The substrate can be in the form of a wafer. Semiconductor substrates such as Si will typically be in the form of a wafer.

Different kinds of plasma production devices suitable for plasma etching are well known to the skilled reader. The present invention can be used in conjunction with a variety of these plasma production devices.

Whilst the invention has been described above, it extends to any inventive combination of features set out above or in the following description. For example, features described in relation to one aspect of the invention are disclosed in relation to another aspect of the invention. Although illustrative embodiments of the invention are described in detail herein with reference to the accompanying drawings, it is to be understood that the invention is not limited to these precise embodiments. Furthermore, it is contemplated that a particular feature described either individually or as part of an embodiment can be combined with other individually described features, or parts of other embodiments, even if the other features and embodiments make no mention of the particular feature. Thus, the invention extends to such specific combinations not already described.

DESCRIPTION OF THE DRAWINGS

The invention will now be described, by way of example only, with reference to the accompanying drawings, in which:

FIG. 3 shows deposition on the RF source window, and indicates the areas which FIGS. 4 and 5 correspond to;

DETAILED DESCRIPTION OF THE DISCLOSURE

The present invention utilises a two-step etching method and corresponding plasma etching apparatus to extend the mean time between chamber cleans.

Figure 1:
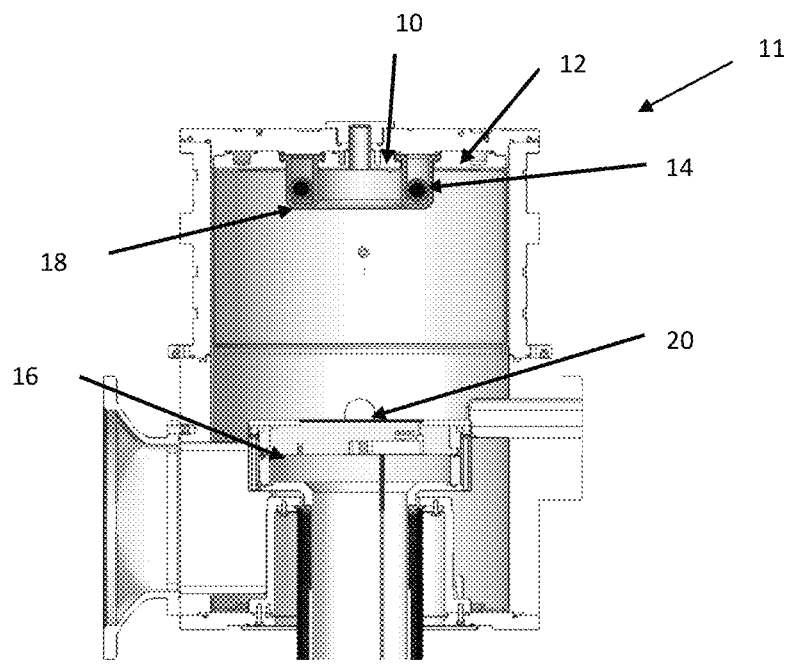
FIGS. 1 and 2 are schematic diagrams of a plasma etching apparatus of the invention.
Figure 2:
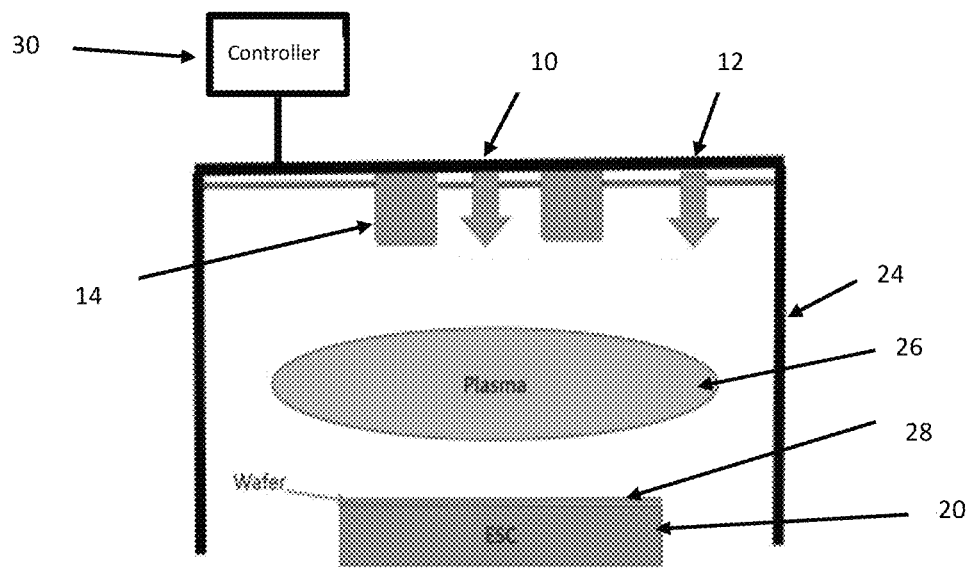

A plasma processing apparatus according to the invention is illustrated in FIGS. 1 and 2. The invention may be performed in an adapted version of the Applicant's Omega® Synapse™ etch process module which has been configured to perform a two-step etching process with gas inlet switching. Well known features such as the exhaust gas pumping system are not shown in FIGS. 1 and 2 but will be well understood by the skilled reader.

The apparatus comprises a plasma etch chamber 11 having a plurality of internal surfaces. The apparatus comprises a first gas inlet arrangement 10, a second gas inlet arrangement 12, a ceramic annular housing 18, an RF antenna 14, a platen RF electrode 16 and a support 20 for supporting a structure 28 undergoing etching. In the embodiment shown in FIGS. 1 and 2, the support 20 is an electrostatic chuck and the platen RF electrode 16 is used to control the directionality of the etch ions. This in turn controls the extent of physical etching achieved during processing. Higher platen powers will increase the substrate etch rate.

The plasma etch chamber 11 has an upper wall or lid. The annular housing 18 is immersed within the chamber 11 and depends downwardly from the upper wall. The annular housing 18 defines a circular region on the interior of the upper wall.

In the embodiment shown in FIGS. 1 and 2, the first gas inlet arrangement 10 is an inner gas plenum and the second gas inlet arrangement 12 is an outer gas plenum. Each gas inlet arrangement comprises a plurality of gas inlets, each gas inlet terminating in an opening through which process gases enter the interior of the chamber 11. The inner plenum 10 sits within the circular region defined by the annular housing 18. The gas inlets of the inner gas plenum 10 are positioned inwardly of the annular housing 18 as a plurality of openings disposed in a circular pattern. The outer plenum 12 is positioned outside the circular region defined by the annular housing 18. The gas inlets of the outer gas plenum 10 are positioned outwardly of the annular housing 18 as a plurality of openings disposed in a circular pattern. The inner gas plenum can have eight gas inlets whereas the outer gas plenum may have about 10 times as many gas inlets. However, it will be appreciated that the first and second gas inlet arrangements can have any suitable number of gas inlets.

The etch chamber is further illustrated in FIG. 2, which illustrates processing of a structure 28 present in the chamber. The chamber comprises a chamber walls 24 within which the structure 28 is placed on the support 20. The plasma 26 is ignited and sustained by RF power coupled into the chamber from an RF power source (not shown) via the RF antenna 14 contained within the annular housing 18. The annular housing 18 acts as a window which allows RF power to be coupled into the chamber. Etch process gases enter the chamber through the gas inlets of either the inner gas plenum 10 or the outer gas plenum 12. A controller 30 is used to switch the gas entry points from the first gas plenum to the second gas plenum.

The invention may be used to etch structures containing PZT (lead zirconate titanate). A typical wafer structure is a silicon substrate base layer followed by an $SiO_2$ layer, a platinum layer, a PZT layer, a second platinum layer and finally a photoresist mask on the upper surface of the wafer. The photoresist mask protects the wafer from plasma etching. The mask is patterned according to the desired etch product. Typically, the platinum electrode layers will have a thickness of 50-250 nm and the PZT layer will have a thickness of 500-2500 nm.

The wafer to be etched is electrostatically clamped to the support 20. Helium is used to cool the wafer.

During the first etch step, a higher platen power is used to etch the PZT at a high rate, with low selectivity (PZT/Pt), to a stop layer. The stop layer is typically a platinum electrode. The platen power is reduced in the second step and may be switched off entirely. The reduced platen power leads to a reduced etch rate of the PZT and increases PZT/PT selectivity. This means that during the second step the plasma will continue to etch any remaining PZT but will not etch the stop layer or remove Pt at a substantially reduced rate.

The internal surfaces of the chamber were textured to improve the adhesion of the first layer of deposited material.

The metal shielding in the chamber was coated with arc-spray Al to achieve a surface roughness of approximately 20-35 μm while the ceramic window 18 was coated with an yttria coating to achieve a surface roughness of approximately 6 μm. Trials were conducted by etching high open area (80% OA) patterned wafers having photoresist mask (4.5 μm thickness)/Pt (100 nm thickness)/PZT (2 μm thickness)/Pt (100 nm thickness) layers formed thereon, using the process conditions shown in Table 1 with either the inner or outer gas plenum used to deliver the etch process gases.

Table 1 shows typical process parameters for each step. PZT etching is typically performed at a chamber temperature of 55° C. and a pressure of 5-50 mTorr.

TABLE 1

|  | Step 1 | Step 2 |
| --- | --- | --- |
| $C_4F_8$ flow (sccm) | 0 | 5-10 |
| $CF_4$:$H_2$ ratio | >1.5:1 | <1:1 |
| Antenna RF power (W) | 1000-1500 | 1500-1900 |
| Platen RF power (W) | 500-1000 | 0-500 |
| Time (min) | 5-10 | 10-15 |

It was found that when the outer gas plenum was used to perform an etch step, deposition was evident on the chamber surface in the vicinity of the outer gas plenum. When the inner gas plenum was used to perform an etch step, deposition was visible on the annular housing and in the vicinity of the inner gas plenum. In excess of 214 microns of PZT was successfully etched using the inner plenum before material de-laminated from the ceramic window of the annular housing.

Figure 3:
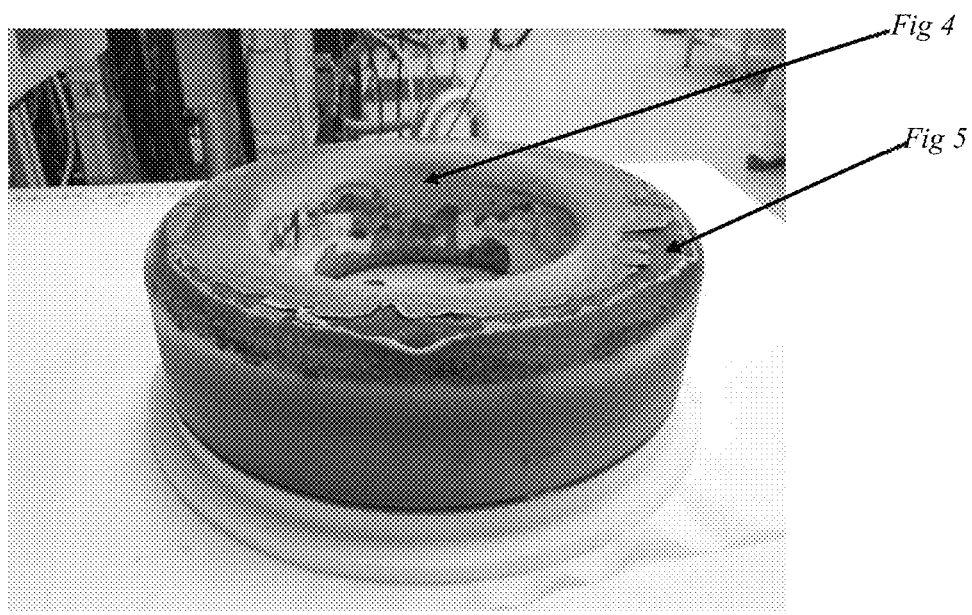

FIG. 3 shows material deposited on the annular housing 18. It can be seen that the material is well-adhered in some areas while it is flaking off in others.

Figure 4:
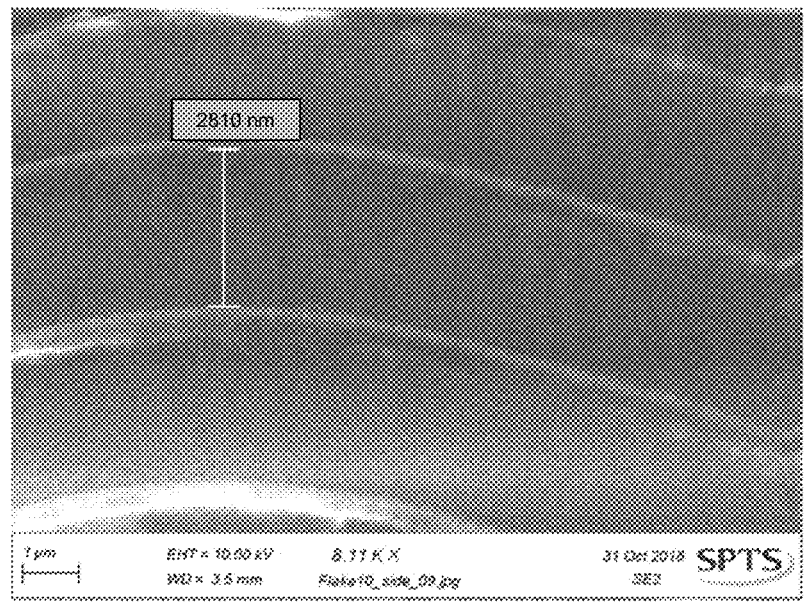
FIG. 4 is an SEM micrograph of the well-adhered material indicated in FIG. 3.

The SEM micrograph shown in FIG. 4 corresponds to the well-adhered area indicated in FIG. 3. Thick layers of fluorocarbon polymer are present between each layer of metallic etch products. As the number of wafers processed in the chamber increases, a laminar structure of etch products and fluorocarbon polymer builds up on the chamber interior.

Figure 5:
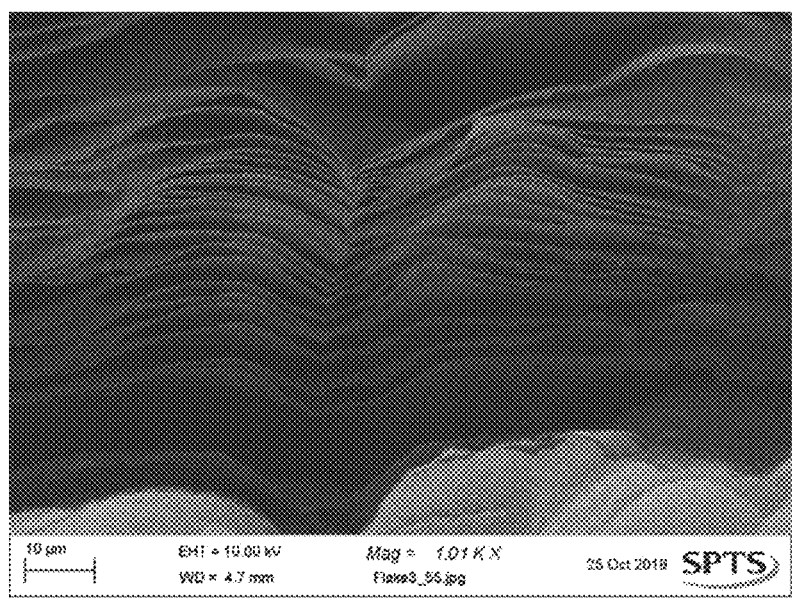
FIG. 5 is an SEM micrograph of the poorly-adhered material indicated in FIG. 3.

In contrast, the SEM micrograph in FIG. 5 is taken from the poorly-adhered area indicated in FIG. 3. In this area, there is a thin or non-existent fluorocarbon layer between the etch product layers. The SEM images indicate that regions where there is a thick fluorocarbon polymer layer between each redeposited etch product layer adhere better than regions where the fluorocarbon layer is thin or absent.

Figure 6:
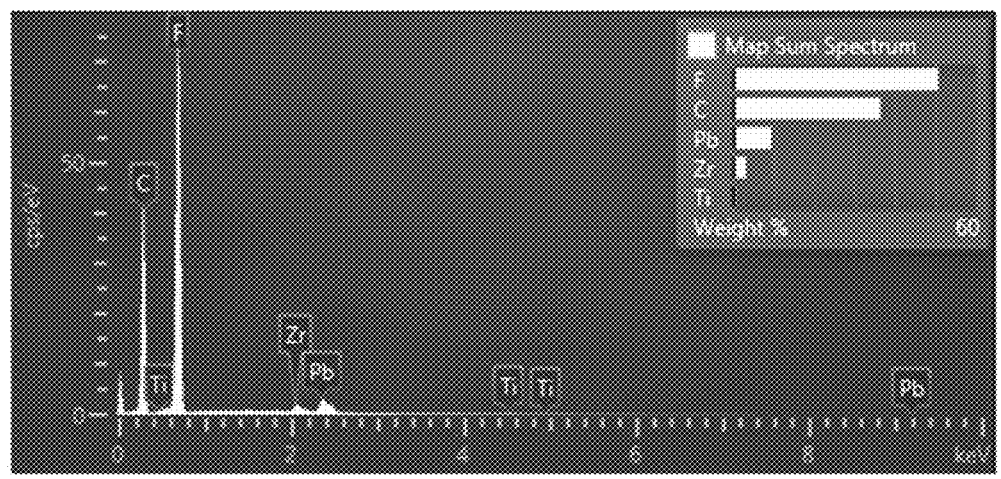
FIG. 6 shows EDX compositional analysis of deposited material layers.

FIG. 6 shows EDX compositional analysis of redeposited material taken from the well-adhered area. The composition of the material is consistent with the presence of thick fluorocarbon layers sandwiched between layers of metal etch product as seen in FIG. 4.

Without wishing to be limited by any particular theory or conjecture, it is believed that there are two main mechanisms of deposition on the chamber interior. The first mechanism is direct deposition of the process gas on the chamber interior. The second is redeposition of etch products from the wafer during etching. It is believed that material deposition from the etch process gas mixture varies throughout the chamber due to local variation in the precursor gas concentration as a function of distance from the gas inlet. This leads to higher deposition in the vicinity of the gas inlets. By using a two-step etching method and switching the position of gas entry between the two etch steps, a more uniform deposition can be achieved, and the time between chamber cleans is extended accordingly. Deposition from the wafer etch products is believed to act in a line-of-sight manner from the wafer, and is therefore not affected by the gas inlets.

Although the invention has proved to be particularly effective in relation to the etching of PZT, the invention can be applied to the etching of other structures which comprise a component which forms involatile metal etch products. For example, the invention can be applied to the back-side etching of SiC using metal masks.

What is claimed is:

1. A method of plasma etching a structure comprising a substrate and a component which forms involatile metal etch products, the method comprising the steps of:
    providing a structure comprising a substrate and a component on top of the substrate which forms involatile metal etch products;
    positioning the structure on a support within a chamber having a first gas inlet arrangement comprising one or more gas inlets and a second gas inlet arrangement comprising one or more gas inlets;
    etching the structure by performing a first plasma etch step using a first etch process gas mixture which is only supplied to the chamber through the first gas inlet arrangement; and
    further etching the structure by performing a second plasma etch step using a second etch process gas mixture which is only supplied to the chamber through the second gas inlet arrangement,
    wherein the first plasma etch step and the second plasma etch step are performed using a plasma production device in the chamber that includes a plasma generating element, wherein the plasma generating element is an RF antenna.

2. The method according to claim 1, wherein the gas inlets of the first gas inlet arrangement are located radially inwardly of the gas inlets of the second gas inlet arrangement or vice versa.

3. The method according to claim 2, wherein the plasma production device radially separates the gas inlets of the first gas inlet arrangement from the gas inlets of the second gas inlet arrangement.

4. The method according to claim 3, wherein the plasma production device comprises an annular housing and the plasma generating element is disposed within the annular housing.

5. The method according to claim 1, wherein the structure is positioned on a support and an RF bias power is applied to the support during the first plasma etch step and the second plasma etch step.

6. The method according to claim 1, wherein the first and second plasma etch steps use different etch process gas mixtures.

7. The method according to claim 6, wherein the second etch process gas mixture includes a fluorocarbon, said fluorocarbon being absent from the first etch process gas mixture.

8. The method according to claim 1, wherein the component of the structure which forms involatile metal etch products is a layer of PZT (lead zirconate titanate) and/or a noble metal electrode.

9. The method according to claim 1, wherein the substrate is a semiconductor substrate.

10. The method according to claim 9, wherein the semiconductor substrate is a silicon substrate.

11. The method according to claim 9, wherein the semiconductor substrate is a SiC substrate and the component which forms involatile metal etch products is a metal mask.

* * * * *